United States Patent
Ahmad et al.

(10) Patent No.: US 10,418,082 B2
(45) Date of Patent: Sep. 17, 2019

(54) MINIMIZING TWO-STEP AND HARD STATE TRANSITIONS IN MULTI-LEVEL STT-MRAM DEVICES

(71) Applicant: KUWAIT UNIVERSITY, Safat (KW)

(72) Inventors: Imtiaz Ahmad, Safat (KW); Mahmoud Imdoukh, Safat (KW); Mohammad G H. Alfailakawi, Safat (KW)

(73) Assignee: Kuwait University, Safat (KW)

( * ) Notice: Subject to any disclaimer, the term of this patent is extended or adjusted under 35 U.S.C. 154(b) by 27 days.

(21) Appl. No.: 15/724,075

(22) Filed: Oct. 3, 2017

(65) Prior Publication Data

US 2019/0103150 A1 Apr. 4, 2019

(51) Int. Cl.
| | |
|---|---|
| *G11C 11/00* | (2006.01) |
| *G11C 11/16* | (2006.01) |
| *G11C 11/56* | (2006.01) |
| *G11C 7/10* | (2006.01) |

(52) U.S. Cl.
CPC ........ *G11C 11/1675* (2013.01); *G11C 7/1006* (2013.01); *G11C 11/1653* (2013.01); *G11C 11/5607* (2013.01)

(58) Field of Classification Search
CPC ............ G11C 11/1675; G11C 11/5607; G11C 11/1653
See application file for complete search history.

(56) References Cited

U.S. PATENT DOCUMENTS

| | | | |
|---|---|---|---|
| 9,153,332 B2 | 10/2015 | Lee | |
| 9,418,721 B2 | 8/2016 | Bose | |
| 9,489,022 B2 | 11/2016 | Kim | |
| 2012/0250404 A1* | 10/2012 | Wang | G11C 11/161 365/171 |
| 2015/0213867 A1 | 7/2015 | Wu | |
| 2017/0286216 A1* | 10/2017 | Kozhikkottu | G06F 3/0619 |
| 2017/0308299 A1* | 10/2017 | Cha | G06F 3/061 |
| 2018/0137005 A1* | 5/2018 | Wu | G11C 29/835 |

OTHER PUBLICATIONS

Hajimiri et al., "Content-aware encoding for improving energy efficiency in multi-level cell resistive random access memory", Nanoscale Architectures (NANOARCH), 2013 IEEE/ACM International Symposium on., IEEE, 2013, 6 pages.

(Continued)

*Primary Examiner* — Toan K Le

(74) *Attorney, Agent, or Firm* — Richard C. Litman

(57) ABSTRACT

Data is stored in a multi-level MRAM (MLC MRAM) cell in a manner that reduces transition states that require high energy. A new data block is received, and the new data block is divided into one or more sub-groups of bits, with each sub-group comprising at least two bits. Each sub-group is assigned data bit locations in a memory store. The received bits are compared with sub-groups present at the data bit locations to determine subgroups of hot bits. For each subgroup of hot bits, an encoding flag value is determined by XORing their most significant bits. The most significant bits of each subgroup of hot bits are complemented and the encoding flag is SET. A data block is generated to establish a data group for each subgroup of hot bits including the subgroup of hot bits and the encoding flag for that subgroup.

8 Claims, 5 Drawing Sheets

(56) References Cited

OTHER PUBLICATIONS

Seyedzadeh et al., "Pres: Pseudo-random encoding scheme to increase the bit flip reduction in the memory", Design Automation Conference (DAC), 2015 52nd ACM/EDAC/IEEE. IEEE, 2015, 7 pages.
Maddah et al., "Cafo: Cost aware flip optimization for asymmetric memories", High Performance Computer Architecture (HPCA), 2015 IEEE 21st International Symposium on. IEEE, 2015, 11 pages.
Jalili et al., "Tolerating more hard errors in MLC PCMs using compression", Computer Design (ICCD), 2016 IEEE 34th International Conference on. IEEE, 2016, 14 pages.
Jalili et al., "Endurance-Aware Security Enhancement in Non-Volatile Memories Using Compression and Selective Encryption", IEEE Transactions on Computers (2016), pp. 304-311.
Zhang et al., "Multi-level Cell STT-RAM: Is it Realistic or Just a Dream?", IEEE/ACM International Conference on Computer-Aided Design (ICCAD) (2012), pp. 526-532.
Shamsi et al., "Reliable and High Performance STT-MRAM Architectures base on Controllable-Polarity Devices", 33rd IEEE International Conference on Computer Design (ICCD)(2015), pp. 343-350.
Mittal, "A Survey of Soft-Error Mitigation Techniques for Non-Volatile Memories", Computers (2017), 6, 8, pp. 1-27.

\* cited by examiner

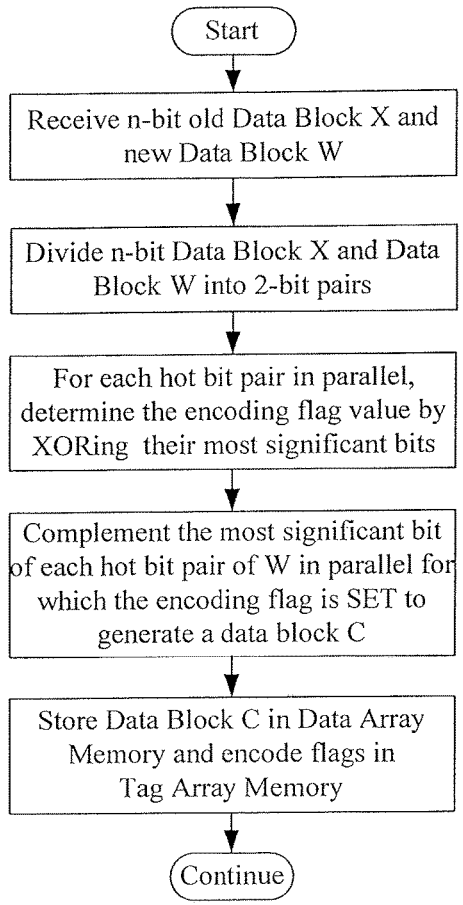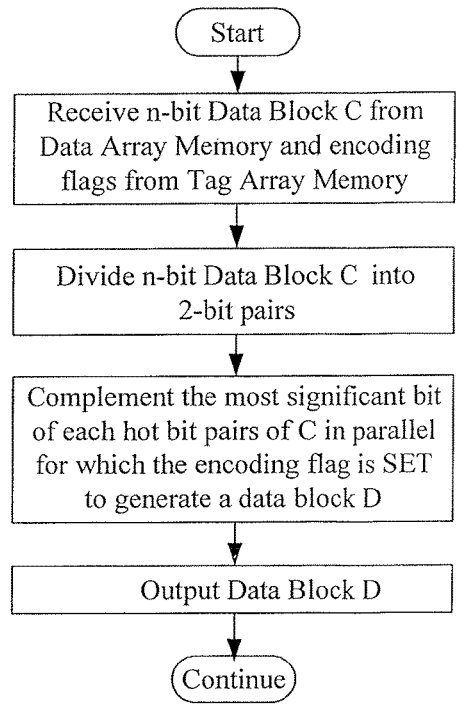
Fig. 7A
Fig. 7B

MINIMIZING TWO-STEP AND HARD STATE TRANSITIONS IN MULTI-LEVEL STT-MRAM DEVICES

BACKGROUND

1. Field

The present disclosure relates to memory bit storage policies used on multi-bit memory storage devices and arrays, and particularly to a method of minimizing two-step and hard state transitions in multi-level STT-MRAM devices that may also be used in on-chip memory used as cache on other devices.

2. Description of the Related Art

The attractive features of spin-torque-transfer magnetic-RAM (STT-MRAM) make it a promising candidate for future on-chip cache memory. Multi-level cell (MLC) MRAM stores more than one bit per cell. The STT-MRAM (also called STT-RAM or sometimes ST-MRAM and ST-RAM) is an advanced type of MRAM device.

Typically, in MLC MRAM, the amount of current flow, rather than simply its presence or absence, is sensed in order to determine the stored logic level. In a typical configuration, the amount of current sensed is used to more precisely measure the level of charge on the device.

Even though 2-bit MLC STT-MRAMs offer more capacity than their one-bit counterparts, 2-bit MLC STT-MRAMs suffer from higher write energy, performance overhead, and reduced cell endurance. The energy and endurance issues are, at least in part, due to a requirement for a two-write transition (TT) and hard transition (HT). Two-write-transitions stem from the fact that bit cell hard and soft domains cannot be switched to two opposite magnetization directions simultaneously; hence requiring two write operations instead of one. Hard transitions are the result of changing bit cell hard domain state. Changing bit cell hard domain state requires larger currents as compared to the soft domain, resulting in increased energy consumption. By way of example, TT write operations consume the most energy and have double the latency as compared to other transitions. In addition, high current and increased number of write operations inversely affect cell lifetime, and thus reliability.

The non-uniform distribution of bit flips in single-level cell (SLC) nonvolatile memory are described in M. Jalili and H. Sarbazi-Azad, "Captopril: reducing the pressure of bit flips on hot locations in non-volatile main memories', Proceedings of the 2016 Design, Automation & Test in Europe Conference & Exhibition, pp. 1116-1119 (2016). The non-uniform distribution of bit flips is addressed with a technique called "Captopril" to benefit from hot locations to minimize bit flips.

Thus, minimizing two-step and hard state transitions in multi-level STT-MRAM devices solving the aforementioned problems is desired.

SUMMARY

In a method of minimizing two-step and hard state transitions in multi-level STT-MRAM, data is stored in a multi-level MRAM (MLC MRAM) cell in a manner that reduces transition states that require high energy. A new data block is received by the MLC MRAM, and the new data block is divided into one or more sub-groups of bits, where each sub-group includes at least two bits. Each sub-group is assigned data bit locations in a memory store. The sub-groups of bits in the received new data block are compared with sub-groups present at the data bit locations in the memory store to determine subgroups of hot bits. For each subgroup of hot bits, an encoding flag value is determined by XORing the most significant bits. If the most significant bits of subgroups differ, then the most significant bits of each subgroup of hot bits are complemented and the encoding flag is SET. A data block is generated to establish a data group for each subgroup of hot bits comprised of the subgroup of hot bits and the encoding flag for that subgroup. The data group is stored at the data bit locations in the memory store.

In particular configurations, the sub-groups comprise data divided into n-bit data blocks. By way of example, 2-bit pairs may be used, and a 1-bit encoding flag may be used to store the encoding flag value.

In a particular configuration, a subset of stored data is received as n-bit data blocks, from a data array memory portion of the memory store, along with encoding flags from a tag array memory portion of the memory store. The n-bit data block is divided into plural-bit subsets and hot bits are identified in the subgroups. The most significant bit of each of the subgroups of hot bits is complemented (provided the encoding flag is set) to generate an output data block, which is provided as an output.

These and other features of the present disclosure will become readily apparent upon further review of the following specification and drawings.

BRIEF DESCRIPTION OF THE DRAWINGS

FIGS. 7A and 7B are flowcharts or flow diagrams showing encoder flow (FIG. 7A) and decoder flow (FIG. 7B) according to the proposed method.

Similar reference characters denote corresponding features consistently throughout the attached drawings.

DETAILED DESCRIPTION OF THE PREFERRED EMBODIMENTS

Minimizing two-step and hard state transitions in multi-level STT-MRAM devices addresses the high write energy use inherent in multi-level cell spin-torque-transfer magnetic RAM (MLC STT-MRAM). By analyzing real applications, it is found that specific locations within a cache block undergo significantly more TT (two-write transitions, where the cell's hard and soft domains cannot switch to two opposite magnetization directions simultaneously) and HT (hard transitions, where the hard domain state requires larger currents to change state than the soft domain, resulting in larger energy consumption) as compared to others, resulting in "hot locations". These "hot locations" are more detrimental to the lifetime and reliability of MRAM device than cache locations that are less subject to TT and HT transitions. The present disclosure is directed to describing a simple and intuitive dynamic encoding scheme that can eliminate some or all TT and HT transitions at "hot locations", thus reducing energy consumption and improving MLC STT-MRAM lifetime. Results, using Princeton Application Repository for Shared-Memory Computers (PARSEC) benchmarks for testing purposes, demonstrate the effectiveness and scalability of the described approach. The power reduction results for PARSEC benchmarks successfully demonstrate suitability of the disclosed technique in reducing energy consumption.

Earlier schemes do not address the occurrence of non-uniform distributions of writes within a cache block that causes hot and cold memory cells. In particular, it can be observed that certain locations undergo more changes than others, and hence become "hot" cells. If hot locations are tracked in applications and TT transitions are reduced in the hot locations, the affected cells will pose less of a reliability concern, which leads to an improved device lifetime.

It has been found by analyzing the behavior of different benchmark applications and identifying hot locations that it is often possible to eliminate TT and HT transitions to extend multi-level cell (MLC) lifetime and improve power consumption. The disclosed technique implements encoding and decoding algorithms by avoiding state transitions that require TT and HT write operations. The TT and HT transitions at each bit pair location of a 64-byte cache block have been studied. The reduced state transitions appear when using the PARSEC 2.1 benchmark Gem5 simulator in Full System mode (ALPHA ISA).

Figure 1A:
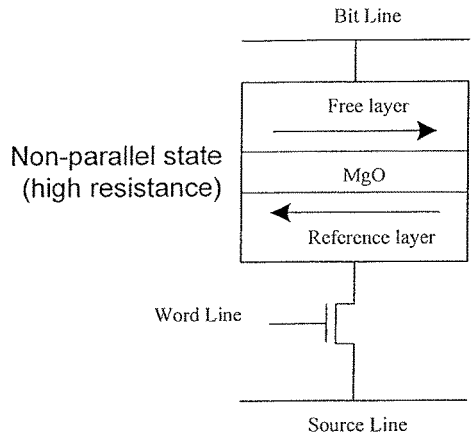
FIGS. 1A and 1B are schematic diagrams showing the magnetic tunnel junction (MTJ) of a single-level cell spin transfer torque magnetic random access memory (SLC STT-MRAM) with the free layer and the reference (pinned) layer in anti-parallel and parallel states, respectively.
Figure 1B:
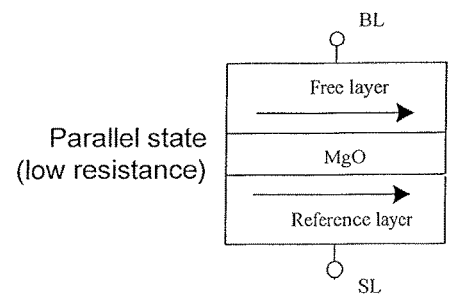
Figure 1C:
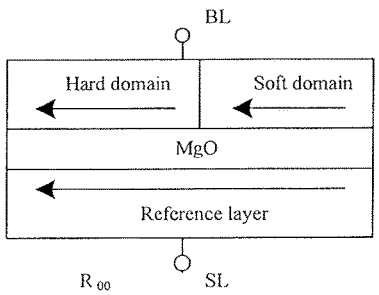
FIGS. 1C, 1D, 1E, and 1F are schematic diagrams showing different resistance levels obtainable in a parallel MLC MTJ of a multi-level cell magnetic random-access memory (MLC MRAM) device, depending upon the relative magnetization direction (parallel/anti-parallel) in the free and reference layers.
Figure 1D:
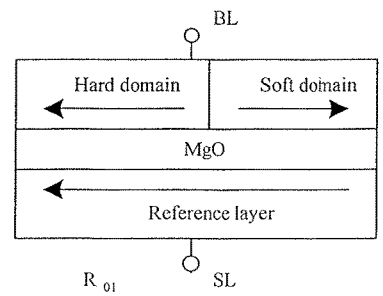
Figure 1E:
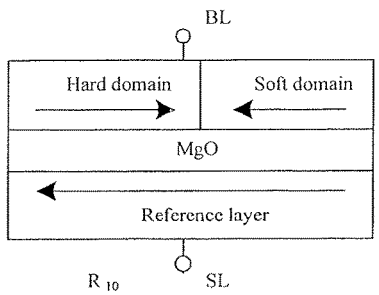
Figure 1F:
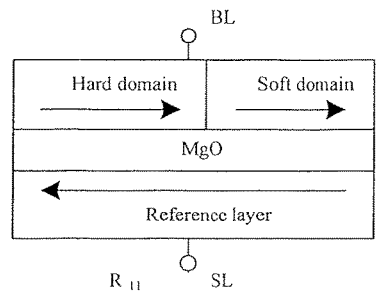

FIGS. 1A-1B are schematic diagrams showing the Magnetic Tunnel Junction (MTJ) of a typical single-level cell (SLC) STT-MRAM device. FIG. 1A schematically shows a non-parallel state (or anti-parallel state) where the magnetization directions of the free layer and the reference layer are in opposite directions. FIG. 1B shows a parallel state in which the magnetization directions of the free layer and the reference layer are in the same direction. The non-parallel state (FIG. 1A) presents a high resistance between the bit line and source, and is presumed to represent a logic or binary '0'. The parallel state (FIG. 1B) presents a low resistance between bit and source, and is presumed to represent a logic or binary '1'. FIGS. 1C-1F show a typical parallel multilevel cell magnetic tunnel junction (MLC MTJ) having different resistances due to the various combinations of magnetization direction (parallel and anti-parallel in the reference layer and in the free layer (the hard domain and the soft domain)).

An MLC STT-MRAM has four resistance states, namely, $R_{00}$, $R_{01}$, $R_{10}$, $R_{11}$, where various transitions can be summarized by the following four types. In the Zero Transition (ZT), the MTJ stays at the original state. In the Soft Transition (ST), only the magnetic orientation of the soft domain needs to be switched. In the Hard Transition (HT), the magnetic orientations of both soft and hard domains are switched. In the Two-step Transition (TT), a two-step write operation is needed to perform the write operation, e.g., one HT followed by one ST.

These state transitions are shown in Table 1. Table 2 shows, by way of non-limiting example, write energy to each of the state transitions shown in Table 1:

TABLE 1

MLC State Transitions

| From | To | | | |
|---|---|---|---|---|
| | $R_{00}$ | $R_{01}$ | $R_{10}$ | $R_{11}$ |
| $R_{00}$ | ZT(0, 0) | ST(0, 1) | TT(1, 2) | HT(1, 1) |
| $R_{01}$ | ST(0, 1) | ZT(0, 0) | TT(1, 2) | HT(1, 1) |
| $R_{10}$ | HT(1, 1) | TT(1, 2) | ZT(0, 0) | ST(0, 1) |
| $R_{11}$ | HT(1, 1) | TT(1, 2) | ST(0, 1) | ZT(0, 0) |

TABLE 2

Example Write Energy (in pJ) for MLC State Transitions

| From | To | | | |
|---|---|---|---|---|
| | $R_{00}$ | $R_{01}$ | $R_{10}$ | $R_{11}$ |
| $R_{00}$ | 0 | 1.83 | 4.64 | 2.72 |
| $R_{01}$ | 1.28 | 0 | 4.64 | 2.72 |
| $R_{10}$ | 3.19 | 5.02 | 0 | 0.44 |
| $R_{11}$ | 3.19 | 5.02 | 1.92 | 0 |

Figure 2A:
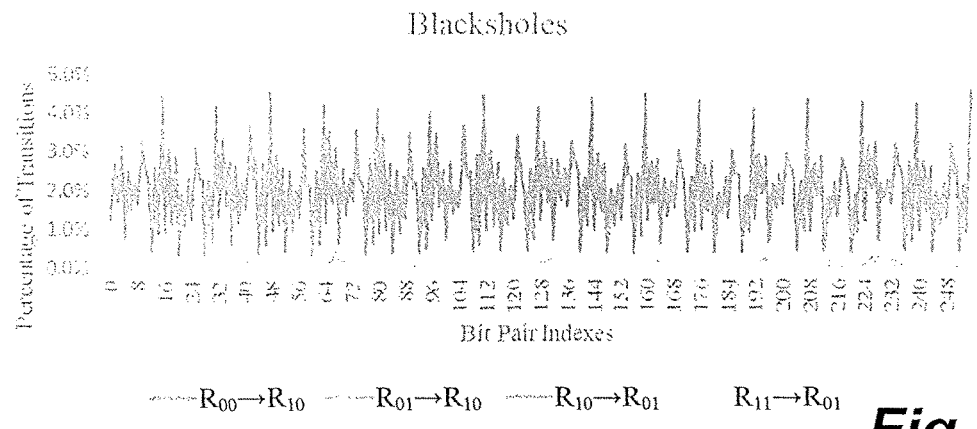
FIGS. 2A, 2B, and 2C are graphs showing the percentage of two-write transitions (TTs) as a function of bit location for the PARSEC (Princeton Application Repository for Shared-Memory Computers) benchmarks Blacksholes (FIG. 2A), Ferret (FIG. 2B), and Fluidanimate (FIG. 2C), respectively.
Figure 2B:
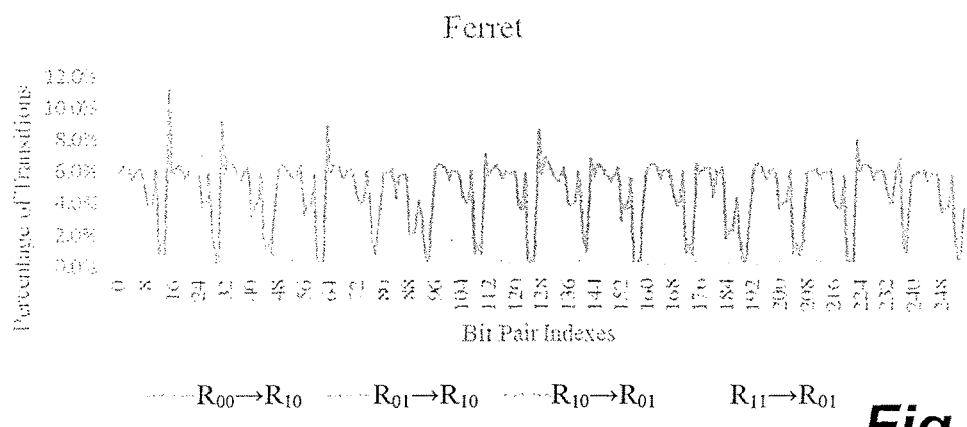
Figure 2C:
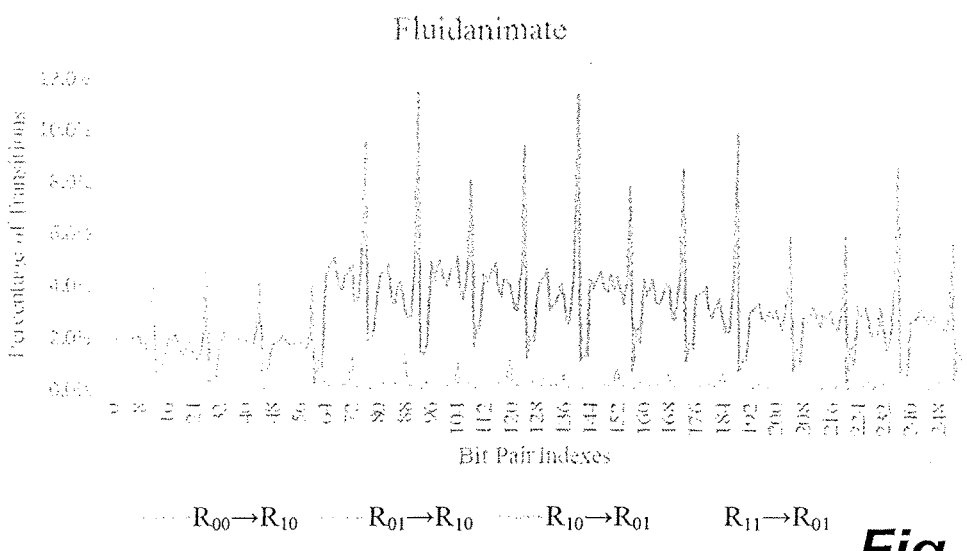

FIGS. 2A-2C show various TT transitions versus bit location for PARSEC benchmarks Blacksholes (FIG. 2A), Ferret (FIG. 2B) and Fluidanimate (FIG. 2C). As can be seen in FIGS. 2A-2C, considerable non-uniformity in the number of TT transitions exists during write operations with respect to bit location within a cache block. The non-uniformity is evident in that some locations undergo more TT transitions (hot locations) as compared with the rest (cold locations). These hot locations, even though minor, are the determining factor of system reliability. Therefore, in order to extend cell endurance, and consequently extend device lifetime, one should reduce the stress exerted on such locations.

From the Rn depictions of the PARSEC benchmarks depicted in FIGS. 2A-2C, it is observed that a significant difference occurs in the transitions from resistance state "00" to "10" ($R_{00} \rightarrow R_{10}$), as opposed to the other transitions. The graphs of FIGS. 2A-2C show that the transitions from resistance state "00" to "10" ($R_{00} \rightarrow R_{10}$), are dominant. Specifically, in reading the graphs, the transitions from resistance state "00" to "10" ($R_{00} \rightarrow R_{10}$) cycle above 4.0% for most transition cycles, whereas the transitions from resistant states "01" to "10" ($R_{01} \rightarrow R_{10}$), "10" to "01" ($R_{10} \rightarrow R_{01}$), and "11" to "01" ($R_{11} \rightarrow R_{01}$) all fall well below 2.0% under the three depicted PARSEC benchmarks. The transitions from resistance states "01" to "10" ($R_{01} \rightarrow R_{10}$), "10" to "01" ($R_{10} \rightarrow R_{01}$), and "11" to "01" ($R_{11} \rightarrow R_{01}$) are nearly superimposed along the bottom of the depicted graphs.

It was observed that among all TT transitions, transitions from resistance state "00" to "10" ($R_{00} \rightarrow R_{10}$) are the dominant ones. Overall, TT transitions may constitute up to 21% of the total transitions in an application, although the actual percentage varies with workload or program execution. By observing TT distribution patterns of real applications, one can predict the range of hot bit locations with high probability. Once the range of hot locations is determined, one can reduce hot bits TTs by employing the encoding scheme described below to enhance device lifetime and reduce system power consumption significantly.

Based on the analysis of benchmarks, such as the Blacksholes (FIG. 2A), Ferret (FIG. 2B), and Fluidanimate (FIG. 2C) PARSEC benchmarks, most of the TT transitions are shown to occur in locations: 13, 29, 45, 61, 77, 93, 109, 125, 141, 157, 173, 189, 205, 221, 237, and 253 for a cache block of size 64 bytes. By studying the addresses of these locations, hot bit addresses can be mathematically formulated as addresses [15x−2, 15x+2] where 1≤x≤16. This range of locations has been found to contain at least one of the hottest locations, along with some other neighboring locations in which the frequency of TT transitions is also high. The samples depicted in FIGS. 2A-2C are examples, and the range of hot locations is expected to change based on the workload.

The disclosed algorithm is based on DCW where input data (w) is compared to pre-existing data (x) and only bit positions with different data bits are written. For a 2-bit MLC STT-RAM, there exist 16 different transitions from old data ($x_i x_{i-1}$) to new data ($w_i w_{i-1}$), as shown in Table 3. For each transition, the type of transition (ZT, ST, HT, TT) is given in column number 1 where HTs and TTs are highlighted (HTs in italics and TTs in bold) for the cases when no encoding is used. One can observe that there are four HTs and four TTs. From the table, it is apparent that a change in the MSB bit will result in either an HT or TT transition. Thus, by treating each such transition as a minterm and collecting all such minterms, one can design a circuit that detects these cases. By way of example, from Table 3, these minterms (in terms of variables are 1000, 1100, 1001, 1101, 0010, 0110, 0011, 0111. Simplifying the expression using K-map, the detection circuits for these cases are given by $x_i \oplus w_1$, where $\oplus$ represents an XOR operation.

XOR is the logical operation "exclusive or", and is an exclusive disjunction logical operation that outputs true only when inputs differ (one is true, the other is false). The XOR operation is identified by the prefix operator J and by the symbol $\oplus$. Execution of an XOR operation is described herein as "XORing" and is performed by an XOR logic gate.

TABLE 3

HT/TT transitions as affected by encoding

| Transition $R_{Old\text{-}data} \rightarrow R_{New\text{-}data}$ | Type of Transition | Transition after Encoding $R_{Old\text{-}data} \rightarrow R_{Encoded\text{-}new\text{-}data}$ | Type of Transition after Encoding | Encoding Flag |
|---|---|---|---|---|
| $R_{00} \rightarrow R_{00}$ | ZT | $R_{00} \rightarrow R_{00}$ | ZT | 0 |
| $R_{01} \rightarrow R_{00}$ | ST | $R_{01} \rightarrow R_{00}$ | ST | 0 |
| $R_{10} \rightarrow R_{00}$ | *HT* | $R_{10} \rightarrow R_{10}$ | ZT | 1 |
| $R_{11} \rightarrow R_{00}$ | *HT* | $R_{11} \rightarrow R_{10}$ | *ST* | 1 |
| $R_{00} \rightarrow R_{01}$ | ST | $R_{00} \rightarrow R_{01}$ | ST | 0 |
| $R_{01} \rightarrow R_{01}$ | ZT | $R_{01} \rightarrow R_{01}$ | ZT | 0 |
| $R_{10} \rightarrow R_{01}$ | TT | $R_{10} \rightarrow R_{11}$ | ST | 1 |
| $R_{11} \rightarrow R_{01}$ | TT | $R_{11} \rightarrow R_{11}$ | ZT | 1 |
| $R_{00} \rightarrow R_{10}$ | TT | $R_{00} \rightarrow R_{00}$ | ZT | 1 |
| $R_{01} \rightarrow R_{10}$ | TT | $R_{01} \rightarrow R_{00}$ | ST | 1 |
| $R_{10} \rightarrow R_{10}$ | ZT | $R_{10} \rightarrow R_{10}$ | ZT | 0 |
| $R_{11} \rightarrow R_{10}$ | ST | $R_{11} \rightarrow R_{10}$ | ST | 0 |
| $R_{00} \rightarrow R_{11}$ | *HT* | $R_{00} \rightarrow R_{01}$ | *ST* | 1 |
| $R_{01} \rightarrow R_{11}$ | *HT* | $R_{01} \rightarrow R_{01}$ | *ZT* | 1 |
| $R_{10} \rightarrow R_{11}$ | ST | $R_{10} \rightarrow R_{11}$ | ST | 0 |
| $R_{11} \rightarrow R_{11}$ | ZT | $R_{11} \rightarrow R_{11}$ | ZT | 0 |

Therefore, HT and TT transitions can be easily identified by using a single XOR-gate. The disclosed encoding scheme inverts the MSB bit of the 2-bit new data before writing data and sets an encoding flag to signify the inversion of MSB bit. By applying this simple rule when TT and HT transitions are detected, all such transitions are eliminated in the encoded data bit, as can be seen in Table 3, column 4 ("Type of Transition after Encoding"). The last column of Table 3 shows the status of the encoding flag, which signifies whether the MSB bit is inverted or not. The disclosed approach simply complements odd bit positions, which correspond to the MSB bit only. As compared to earlier approaches, in which all bits are complemented, or such operations as rotate are performed, the presently disclosed approach is capable of removing all HT and TT transitions. Furthermore, the disclosed approach does not require counters or other computational modules, such as adders or comparators, to perform encoding, as is the case in other approaches.

Figure 3:
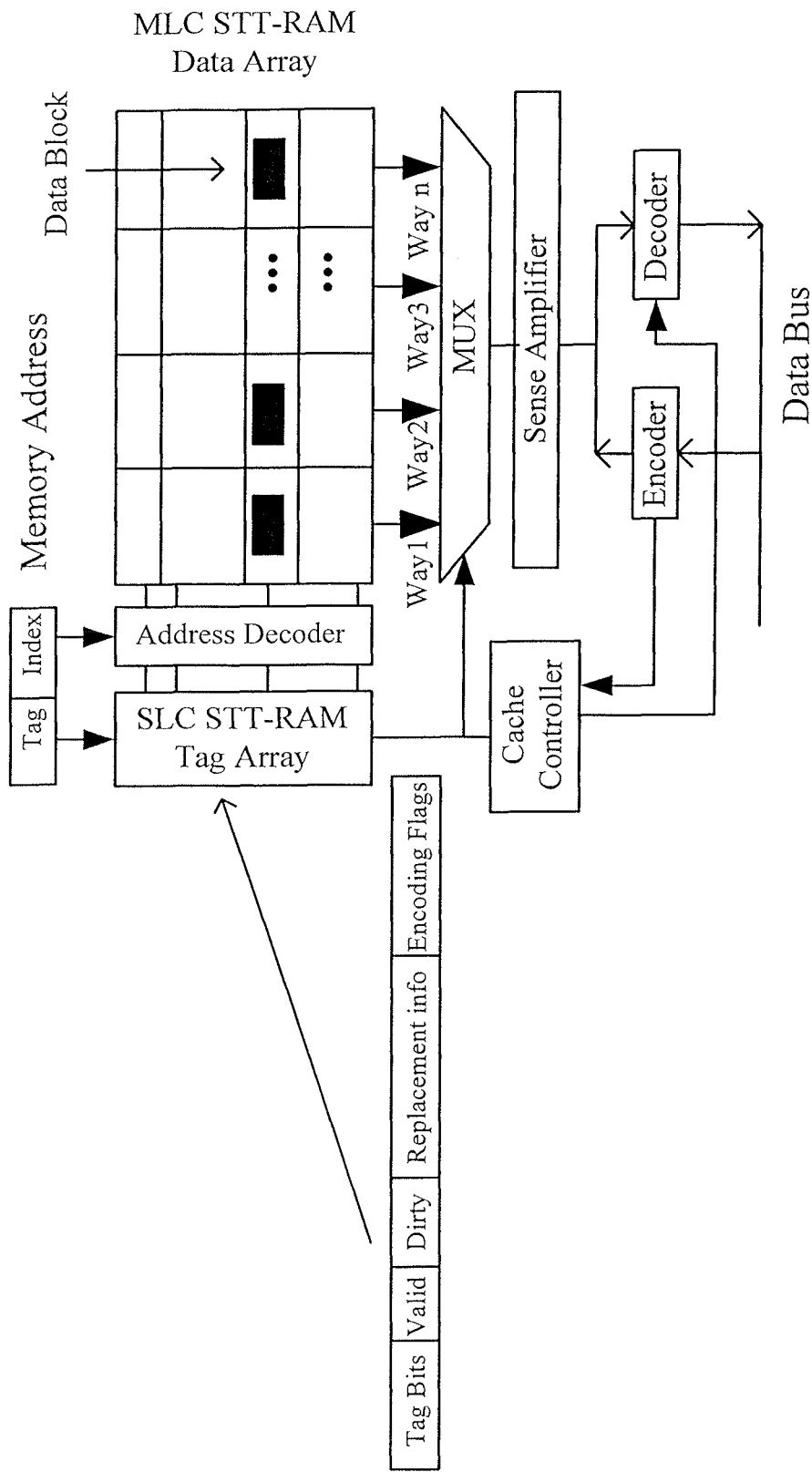
FIG. 3 is a schematic block diagram showing a typical n-way set-associative MLC STT-RAM-based cache organization.

FIG. 3 is a schematic block diagram showing a typical n-way set-associative MLC STT-RAM-based cache organization. The MLC STT-RAM-based cache organization comprises a memory array, a tag array, an address decoder, a cache controller, and sense amplifiers. The data array comprises a 2-bit MLC STT-MRAM that stores data blocks for each set in the cache. The tag array stores a tag for each data block and corresponding control bits, such as valid bits, dirty bits, and other control bits. The address decoder uses a memory address to select data and tag information from the appropriate cache set. The cache controller detects cache hits/misses and controls the sending and receiving of data. The sense amplifiers are used to sense data stored in the addressed cells and output them using appropriate voltage signals. The MUX selects appropriate cache blocks within the set based on tag match decisions. Three additional components, comprising encoding flags, encoder, and decoder units, are incorporated in cache management architecture to implement the scheme depicted in FIG. 3.

The tag array for a typical cache block contains the tag bits, valid and dirty bits, and replacement policy (e.g., "least recently used") bits, which are used by the cache controller to determine the cache hit or miss, and other cache replacement operations. The tag array is augmented for each block with an additional field called "Encoding Flags". The technique requires a 1-bit encoding flag for each hot bit pair in the data block. Therefore, the number of encoding flags will depend upon the number of hot bit pairs being considered. The encoding flag stores whether the most significant bit of the corresponding hot data bit pair is stored in the complemented (encoding flag=1) or un-complemented form (encoding flag=0).

The technique encodes each 2-bits of data in the MLC array by using an extra encoding bit in tag array using a new field called "encoding flag". The encoding bit, which can be either 0 or 1, determines MSB bit encoding for each 2 bits. Therefore, the encoding flag field consists of a vector for each 2-bits of data within hot locations range. Since the range of hot regions is very limited, only a limited number of additional bits will be required. When writing data, the encoder converts the data to encoded form and transfers it to a target cache block. The encoding can be performed in parallel with a tag matching operation, which reduces or eliminates additional latency. The decoder, on the other hand, accepts data from the data array and converts it to normal format. It is also possible to store encoding flags in the data array.

Figure 4:
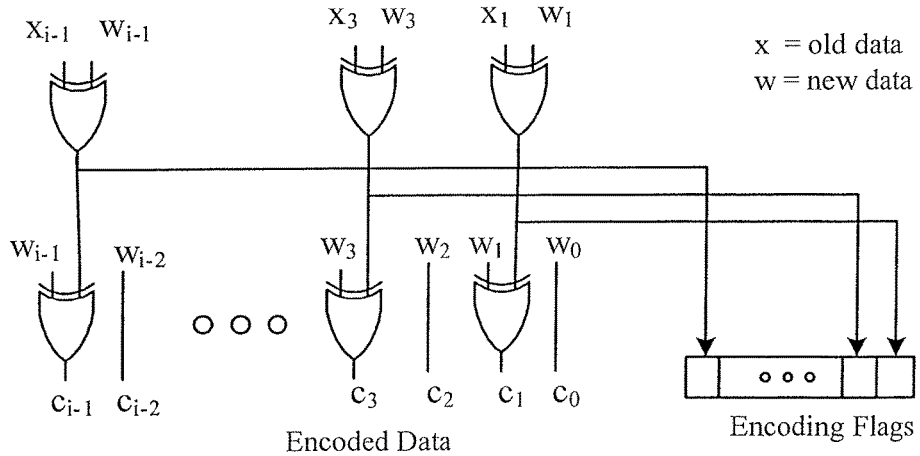
FIG. 4 is a schematic diagram showing an exemplary encoding architecture for minimizing TTs and HTs (hard transitions) in an MLC STT-MRAM.
Figure 5:
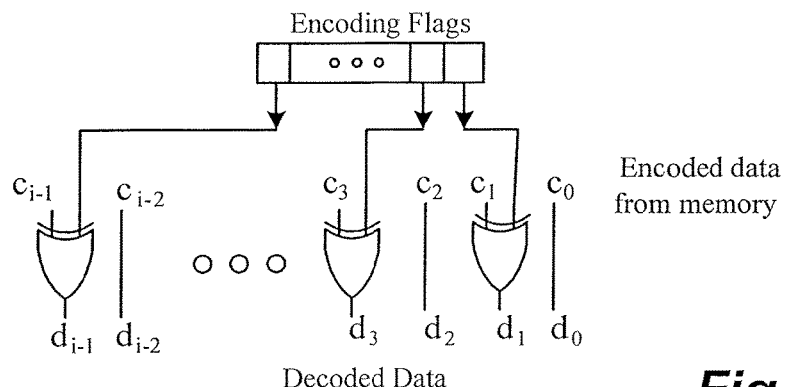
FIG. 5 is a schematic diagram showing an exemplary decoding architecture for minimizing TTs and HTs (hard transitions) in an MLC STT-MRAM.

FIG. 4 is a schematic diagram showing a non-limiting example of the encoding architecture used in a two-step and hard detection circuit. FIG. 5 is a schematic diagram showing an example of the decoding architecture. Both encoding and decoding architectures are very simple and fast, and the logic itself consists of only XOR gates. In FIG. 4, old data (data in memory) is denoted as X and new data (data to be written to memory) is denoted as W. Therefore, in the encoder architecture shown in FIG. 4, old data is denoted as $X_{n-1} X_{n-2} \ldots X_1 X_0$, and new data is denoted as $W_{n-1} W_{n-2} \ldots W_1 W_0$. The XOR-gates detect HT and TT transitions based on old/new data bits $X_i$, $W_i$ at odd bit positions within hot locations range. Then based on the transition detected, the corresponding bit $W_i$ is either inverted or left unchanged to produce the encoded bit $C_i$. In addition, the output of the XOR gate is stored (in encoding flags field) in tag array to be used later during the decoding process.

The decoder architecture is very simple as well, and is shown in FIG. 5. The decoder circuit uses data stored in encoding fields to decode the encoded data to its earlier format. Due to the simplicity of both encoding and decoding hardware, it has a marginal impact on both performance and energy of the cache. The disclosed technique applied for m hot locations within a block will require only 3 m XOR gates and m encoding flags.

Figure 6A:
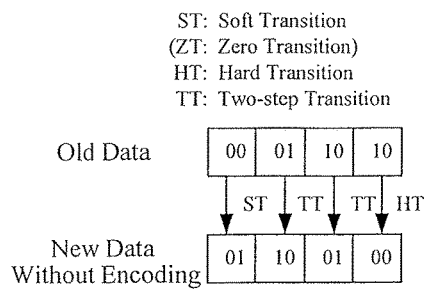
FIGS. 6A and 6B are bit transition block diagrams, comparing bit transitions without encoding (FIG. 6A) and bit transitions with encoding (FIG. 6B) according to the proposed method to show the energy savings.
Figure 6B:
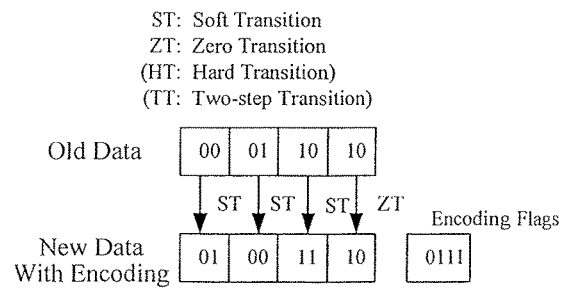

FIGS. 6A and 6B are block bit transition diagrams, showing bit transitions without encoding (FIG. 6A) and bit transitions with encoding (FIG. 6B). To demonstrate the capabilities of the algorithm, consider an 8-bit data, w=01100100, to be written in place of value x=00011010. If the data is not encoded, it results in 2 TT, 1 HT and 1 ST transitions, as shown in FIG. 6A. If the data is encoded according to the disclosed technique, all TT and HT transitions are eliminated, and only three ST transitions are performed, as depicted in FIG. 6B. In this example, four encoding flags are used. The energy consumption using the transition energy values given in Table 2 is 16.68 pJ when no encoding is used, as compared to 3.55 pJ when encoding is used. Thus, a saving of almost five times in write energy is obtained by encoding as described herein.

Moreover, eliminating transitions in hot locations increases cell lifetime, and hence enhances reliability. Table 4 shows examples of reductions in TT hits in a specified range. Table 5 shows TT and HT elimination resulting from encoding applied to all bits. Table 5 uses the Swaptions PARSEC benchmark:

TABLE 4

Percent TT reduction by applying encoding in a specified range

| Workload | Range [15x − 2, 15x + 2] |
|---|---|
| Blackscholes | 31.23% |
| Bodytrack | 31.28% |

TABLE 4-continued

Percent TT reduction by applying encoding in a specified range

| Workload | Range [15x − 2, 15x + 2] |
|---|---|
| Canneal | 29.96% |
| Dedup | 31.27% |
| Facesim | 31.20% |
| Ferret | 31.56% |
| Fluidanimate | 31.71% |
| Freqmine | 31.21% |
| Rtview | 31.24% |
| Streamcluster | 30.59% |
| Swaptions | 32.35% |
| Vips | 31.19% |
| X264 | 30.97% |
| Average | 31.21% |

TABLE 5

TT and HT elimination by applying encoding to all bits (Swaptions)

| Transition $R_{Old-data} \rightarrow R_{New-data}$ | Type of Transition | % Transitions before Encoding | % Transitions after Encoding |
|---|---|---|---|
| $R_{00} \rightarrow R_{00}$ | ZT | 44.41% | 48% |
| $R_{01} \rightarrow R_{00}$ | ST | 2.94% | 6% |
| $R_{10} \rightarrow R_{00}$ | HT | 3.02% | 0.00% |
| $R_{11} \rightarrow R_{00}$ | HT | 3.15% | 0.00% |
| $R_{00} \rightarrow R_{01}$ | ST | 3.02% | 6% |
| $R_{01} \rightarrow R_{01}$ | ZT | 4.54% | 7% |
| $R_{10} \rightarrow R_{01}$ | TT | 2.69% | 0.00% |
| $R_{11} \rightarrow R_{01}$ | TT | 2.56% | 0.00% |
| $R_{00} \rightarrow R_{10}$ | TT | 3.10% | 0.00% |
| $R_{01} \rightarrow R_{10}$ | TT | 2.69% | 0.00% |
| $R_{10} \rightarrow R_{10}$ | ZT | 5.42% | 8% |
| $R_{11} \rightarrow R_{10}$ | ST | 2.75% | 5% |
| $R_{00} \rightarrow R_{11}$ | HT | 3.25% | 0.00% |
| $R_{01} \rightarrow R_{11}$ | HT | 2.56% | 0.00% |
| $R_{10} \rightarrow R_{11}$ | ST | 2.75% | 6% |
| $R_{11} \rightarrow R_{11}$ | ZT | 11.16% | 14% |

FIGS. 7A and 7B are flowcharts or flow diagrams showing encoder flow (FIG. 7A) and decoder flow (FIG. 7B). The encoder flow is part of the WRITE operation and the decoder flow is part of the READ operation.

Referring to FIG. 7A, encoding comprises receiving an old data block X and new data block W. The X and W data blocks are divided into 2-bit pairs, in which the bits are considered parallel bits. For each hot bit pair, the encoding flag value is determined by XORing the most significant bits. If the XORing operation results in logic 1, then the most significant bit of each hot bit pair of Data Block W bits is complemented, so that the encoding flag is SET to generate a Data Block C.

Data Block C is stored in Data Array Memory and the encoding flags corresponding to Data Block C are stored in Tag Array Memory.

Referring to FIG. 7B, decoding comprises reversing the encoding process, but the encoding flag is already determined in the encoding operation. An n-bit Data Block C is received from Data Array Memory, along with encoding flags, which are received from Tag Array Memory. The n bit Data Block C is divided into 2-bit pairs. The most significant bit of each hot pair of C for which the Encoding Flag is SET is complemented to generate a Data Block D. The Data Block D is output.

Although STT-MRAM has many attractive features, it also has disadvantages that could hinder its adoption in some memory systems. Multi-level cell (MLC) write operations may be slower and more energy-consuming, as compared to the single-level cell (SLC) case. In prior attempts, several encoding methods have been proposed to reduce write operation energy consumption and increase STT-MRAM lifetime. Since both read energy and latency of STT-MRAM are very low, replacing a write operation with a read-modify-write operation is an efficient way to reduce energy consumption. Although, MLC STT-MRAM improves density, it doubles read and write latencies, as compared to the SLC counterpart. In the MLC case, hard bits are fast to read, but slow to write, whereas soft bits are fast to write, but slow to read.

Even though the approach was originally configured to reduce TT and HT transitions in specific hot locations, the technique can be extended to all cache locations. The storage overhead can be comparable with earlier approaches if the technique is implemented for all data bits of a cache block. The disclosed technique can be complemented with data compression techniques to amortize the storage overhead and provide even further savings in terms of power consumption and reliability.

The disclosed technology uses the concept of "hot locations" in STT-MRAM with respect to TT and HT transitions. This takes advantage of the common circumstance in which bit pairs at certain locations within a data block undergo more TT/HT transitions as compared to other bit pairs; hence severely impacting cell reliability. The disclosed technique uses this non-uniformity of TT and HT transitions in bit pairs by identifying the locations of "hot" bits within a cache block. The technique uses a simple TT and HT detector circuit for STT-MRAM by implementing a simple and intuitive encoding scheme. This reduces energy consumption of MLC STT-MRAM by elimination of TT and HT at hot locations, and thus enhances MRAM lifetime. The encoder and decoder circuits are provided at the architectural level that does not require any complex computational components, and thus are energy-efficient and fast compared to other low power encoding approaches. The disclosed technique can complement or can be integrated with existing techniques and can be implemented in software, firmware, hardware or combination of hardware and software.

The disclosed scheme is an attractive design option for energy-efficient and reliable MLC STT-MRAM on-chip cache memory. It is noted that the disclosed techniques are not limited, and can be used for other memory arrays and other devices that use memory blocks where write transitions incur increased energy use and affect device lifetime. The technique also is useful in memory blocks where TT and HT transitions can occur, in that latency from the use of control bits is at least partially offset by the reduction of TT and HT transitions. While increased overhead is incurred by the use of control bits, the disclosed technique can be complemented with data compression techniques to amortize the storage overhead and provide even further savings in terms of power consumption and reliability.

It is to be understood that minimizing two-step and hard state transitions in multi-level STT-MRAM is not limited to the specific embodiments described above, but encompasses any and all embodiments within the scope of the generic language of the following claims enabled by the embodiments described herein, or otherwise shown in the drawings or described above in terms sufficient to enable one of ordinary skill in the art to make and use the claimed subject matter.

We claim:

1. A method for minimizing two-step and hard transitions in a multi-level STT-MRAM device, comprising the steps of:
    receiving a new data block;
    dividing the new data block into one or more sub groups of bits, each sub group comprising at least two bits;
    assigning each sub group data bit locations in a memory store;
    comparing the sub groups of bits in the received new data block with sub groups present at the data bit locations in the memory store to determine subgroups of hot bits;
    for each subgroup of hot bits, determining an encoding flag value by XORing their most significant bits;
    complementing the most significant bits of each subgroup of hot bits and SET the encoding flag, and generating a data block so as to establish a data group for each subgroup of hot bits comprised of the subgroup of hot bits and the encoding flag for that subgroup; and
    storing the data group at the data bit locations.

2. The method for minimizing two-step and hard transitions according to claim 1, further comprising the step of using a 1-bit encoding flag to store the encoding flag value.

3. The method for minimizing two-step and hard transitions according to claim 1, further comprising a read operation, the read operation comprising the steps of:
    reading at least a subset of the stored data;
    within the subset of stored data, receiving an n bit data block from a data array memory portion of the memory store and receiving encoding flags from a tag array memory portion of the memory store;
    dividing the n bit data block into plural bit subsets;
    identifying at least a subset of the subgroups of hot bits; and
    complementing the most significant bit of each of the subgroups of hot bits to generate an output data block.

4. The method for minimizing two-step and hard transitions according to claim 1, further comprising a read operation, the read operation comprising the steps of:
    reading at least a subset of the stored data;
    within the subset of stored data, receiving an n bit data block from a data array memory portion of the memory store and receiving encoding flags from a tag array memory portion of the memory store;
    dividing the n bit data block into 2 bit pairs;
    identifying at least a subset of the 2 bit pairs as the subgroups of hot bits and for each 2 bit pair, using a 1 bit encoding flag to store the encoding flag value;
    complementing the most significant bit of each of the hot bit pairs in parallel to generate an output data block; and
    providing the output data block as an output.

5. A multi-level MRAM (MLC RAM) device, comprising:
    means for receiving a new data block;
    means for dividing the new data block into one or more sub groups of bits, each sub group comprising at least two bits and assigning each sub group data bit locations in a memory store;
    means for comparing the sub groups of bits in the received new data block with sub groups present at the data bit locations in the memory store to determine subgroups of hot bits;
    means for, for each subgroup of hot bits, determining an encoding flag value by XORing their most significant bits, and complementing the most significant bits of each subgroup of hot bits and SET the encoding flag;

means for generating a data group for each subgroup of hot bits comprised of the subgroup of hot bits and the encoding flag for that subgroup; and means for storing the data group at the data bit locations.

6. The MLC MRAM as described in claim 5, wherein the means for generating a data group for each subgroup of hot bits uses a 1 bit encoding flag to store the encoding flag value.

7. The MLC MRAM as described in claim 5, further comprising:

means for reading at least a subset of the stored data;

means for, within the subset of stored data, receiving an n bit data block from a data array memory portion of the memory store and receiving encoding flags from a tag array memory portion of the memory store;

means for dividing the n bit data block into plural bit subsets;

means for identifying at least a subset of the subgroups of hot bits; and means for complementing the most significant bit of each of the subgroups of hot bits to generate an output data block.

8. The MLC MRAM as described in claim 5, further comprising a read operation, the read operation comprising:

means for reading at least a subset of the stored data;

means for within the subset of stored data, receiving an n bit data block from a data array memory portion of the memory store and receiving encoding flags from a tag array memory portion of the memory store;

means for dividing the n bit data block into 2 bit pairs;

means for identifying at least a subset of the 2 bit pairs as the subgroups of hot bits and for each 2 bit pair, using a 1 bit encoding flag to store the encoding flag value;

means for complementing the most significant bit of each of the hot bit pairs in parallel to generate an output data block; and means for providing the output data block as an output.

* * * * *